(12) United States Patent
Hsieh et al.

(10) Patent No.: US 9,684,236 B1
(45) Date of Patent: Jun. 20, 2017

(54) METHOD OF PATTERNING A FILM LAYER

(71) Applicant: Taiwan Semiconductor Manufacturing Co., Ltd., Hsin-Chu (TW)

(72) Inventors: Ken-Hsien Hsieh, Taipei (TW); Kuan-Hsin Lo, Nantou County (TW); Shih-Ming Chang, Hsinchu County (TW); Wei-Liang Lin, Hsin-Chu (TW); Joy Cheng, Hsin-Chu (TW); Chun-Kuang Chen, Hsinchu County (TW); Ching-Yu Chang, Yilang County (TW); Kuei-Shun Chen, Hsinchu (TW); Ru-Gun Liu, Hsinchu County (TW); Tsai-Sheng Gau, HsinChu (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/073,073

(22) Filed: Mar. 17, 2016

(51) Int. Cl.
*G03F 7/11* (2006.01)
*G03F 7/40* (2006.01)
(Continued)

(52) U.S. Cl.
CPC .............. *G03F 7/002* (2013.01); *B82Y 10/00* (2013.01); *B82Y 40/00* (2013.01); *G03F 7/165* (2013.01); *G03F 7/20* (2013.01); *G03F 7/2022* (2013.01); *G03F 7/2059* (2013.01); *G03F 7/32* (2013.01); *G03F 7/40* (2013.01); *H01L 21/0274* (2013.01); *H01L 21/02112* (2013.01); *H01L 21/02118* (2013.01); *H01L 21/02318* (2013.01); *H01L 21/3065* (2013.01); *H01L 21/3081* (2013.01);
(Continued)

(58) Field of Classification Search
CPC . G03F 7/002; G03F 7/165; G03F 7/20; G03F 7/32; G03F 7/40; G03F 7/2059; G03F 7/2022; H01L 21/0274; H01L 21/02112; H01L 21/3065; B82Y 10/00; B82Y 40/00
USPC .... 430/270.1, 311, 313, 314, 317, 322, 325, 430/329, 330, 331; 438/700, 689, 699, 438/781; 216/47, 51
See application file for complete search history.

(56) References Cited

U.S. PATENT DOCUMENTS 8,039,179 B2   10/2011   Shieh et al.
8,202,681 B2   6/2012    Lin et al.
(Continued)

OTHER PUBLICATIONS

Hanqiong Hu, Manesh Gopinadhan, and Chinedum O. Osuji, Directed Self-Assembly of Block Copolymers: a Tutorial Review of Strategies for Enabling Nanotechnology with Soft Matter, The Royal Society of Chemistry 2014, Mar. 21, 2014, pp. 3867-3889, Soft Matter, 2014, 10, National Taiwan University.

*Primary Examiner* — Amanda C Walke
(74) *Attorney, Agent, or Firm* — Haynes and Boone, LLP

(57) ABSTRACT

A method of fabricating a semiconductor device is disclosed. The method includes forming a first patterned hard mask over a material layer. The first patterned hard mask defines an opening. The method also includes forming a direct-self-assembly (DSA) layer having a first portion and a second portion within the opening, removing the first portion of the DSA layer, forming spacers along sidewalls of the second portion of the DSA layer and removing the second portion of the DSA layer. The spacers form a second patterned hard mask over the material layer.

20 Claims, 12 Drawing Sheets

(51) Int. Cl.
*G03F 7/00* (2006.01)
*H01L 21/308* (2006.01)
*H01L 21/311* (2006.01)
*H01L 21/02* (2006.01)
*H01L 21/3213* (2006.01)
*G03F 7/20* (2006.01)
*G03F 7/16* (2006.01)
*G03F 7/32* (2006.01)
*H01L 21/027* (2006.01)
*B82Y 10/00* (2011.01)
*B82Y 40/00* (2011.01)
*H01L 21/3065* (2006.01)

(52) U.S. Cl.
CPC .... *H01L 21/3086* (2013.01); *H01L 21/31138* (2013.01); *H01L 21/31144* (2013.01); *H01L 21/32139* (2013.01)

(56) References Cited

U.S. PATENT DOCUMENTS

| | | | |
|---|---|---|---|
| 8,728,332 B2 | 5/2014 | Lin et al. | |
| 8,822,243 B2 | 9/2014 | Yan et al. | |
| 2006/0091468 A1 | 5/2006 | Liaw | |
| 2008/0299774 A1* | 12/2008 | Sandhu | H01L 21/0337 438/696 |
| 2009/0093133 A1* | 4/2009 | Doris | B82Y 30/00 438/781 |
| 2010/0124826 A1* | 5/2010 | Millward | B81C 1/00031 438/780 |
| 2011/0033786 A1* | 2/2011 | Sandhu | H01L 21/0337 430/5 |
| 2011/0281208 A1 | 11/2011 | Lin et al. | |
| 2012/0103935 A1* | 5/2012 | Cheng | H01L 21/0337 216/37 |
| 2012/0278776 A1 | 11/2012 | Lei et al. | |
| 2013/0183827 A1* | 7/2013 | Millward | H01L 21/0273 438/694 |
| 2013/0295769 A1 | 11/2013 | Lin et al. | |
| 2013/0320451 A1 | 12/2013 | Liu et al. | |
| 2014/0097520 A1* | 4/2014 | Millward | H01L 21/76816 257/622 |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2014/0315390 A1* | 10/2014 | Abdallah | H01L 21/3081 438/703 |
| 2016/0104628 A1* | 4/2016 | Metz | H01L 21/3086 438/703 |

\* cited by examiner

METHOD OF PATTERNING A FILM LAYER

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, improvements in methods for patterning a film layer having smaller and smaller critical dimension features are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
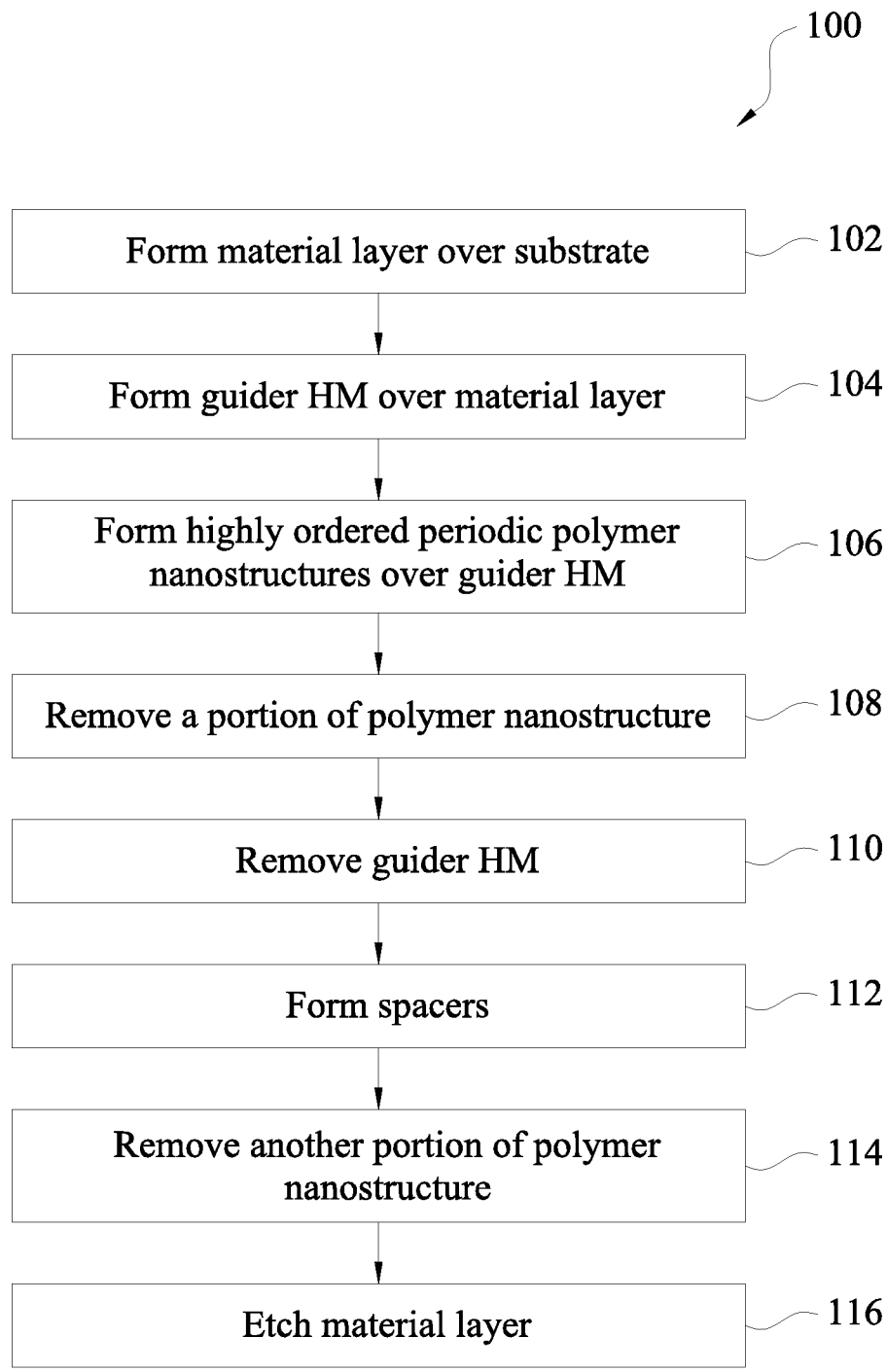
FIG. 1 is a flowchart of an example method for fabricating a semiconductor device constructed in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flowchart of a method 100 of fabricating one or more semiconductor devices in accordance with some embodiments. The method 100 is discussed in detail below, with reference to a semiconductor device 200, shown in FIGS. 2, 3, 4A, 4B, 4C, 5, 6, 7, 8, 9A and 9B.

Figure 2:
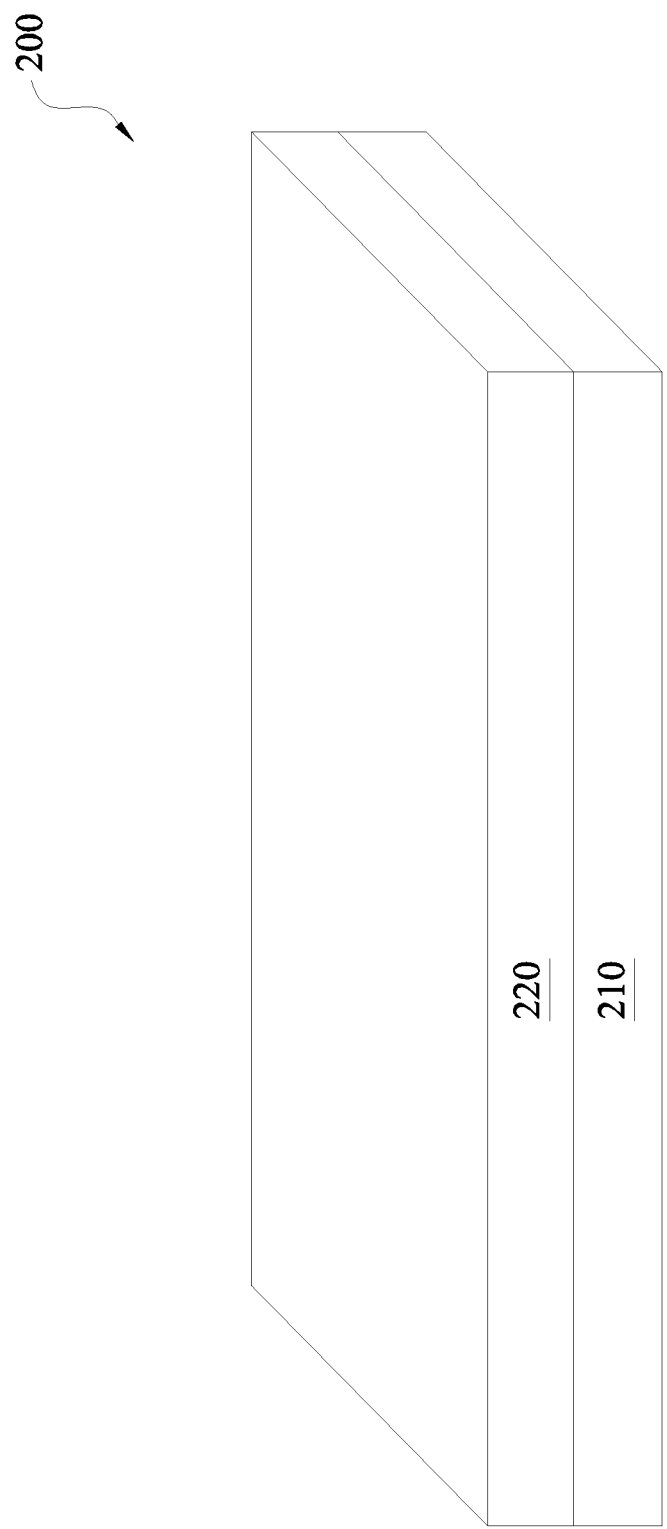
FIGS. 2, 3, 4A, 4B, 4C, 5, 6, 7, 8, 9A and 9B are cross-sectional views of an example semiconductor device in accordance with some embodiments.

Referring to FIGS. 1 and 2, the method 100 begins at step 102 by forming a material layer 220 over a substrate 210. The substrate 210 includes silicon. Alternatively or additionally, the substrate 210 may include other elementary semiconductor such as germanium. The substrate 210 may also include a compound semiconductor such as silicon carbide, gallium arsenic, indium arsenide, and indium phosphide. The substrate 210 may include an alloy semiconductor such as silicon germanium, silicon germanium carbide, gallium arsenic phosphide, and gallium indium phosphide. In one embodiment, the substrate 210 includes an epitaxial layer. For example, the substrate 210 may have an epitaxial layer overlying a bulk semiconductor. Furthermore, the substrate 210 may include a semiconductor-on-insulator (SOI) structure. For example, the substrate 210 may include a buried oxide (BOX) layer formed by a process such as separation by implanted oxygen (SIMOX) or other suitable technique, such as wafer bonding and grinding.

The substrate 210 may also include various p-type doped regions and/or n-type doped regions, implemented by a process such as ion implantation and/or diffusion. Those doped regions include n-well, p-well, light doped region (LDD) and various channel doping profiles configured to form various integrated circuit (IC) devices, such as a complimentary metal-oxide-semiconductor field-effect transistor (CMOSFET), imaging sensor, and/or light emitting diode (LED). The substrate 210 may further include other functional features such as a resistor or a capacitor formed in and on the substrate.

The substrate 210 may also include various isolation regions. The isolation regions separate various device regions in the substrate 210. The isolation regions include different structures formed by using different processing technologies. For example, the isolation region may include shallow trench isolation (STI) regions. The formation of an STI may include etching a trench in the substrate 210 and filling in the trench with insulator materials such as silicon oxide, silicon nitride, and/or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features.

The substrate 210 may also include a plurality of inter-level dielectric (ILD) layers such as silicon oxide, silicon nitride, silicon oxynitride, a low-k dielectric, silicon carbide, and/or other suitable layers. The ILD may be deposited by thermal oxidation chemical vapor deposition (CVD), atomic layer deposition (ALD), physical vapor deposition (PVD), thermal oxidation, combinations thereof, or other suitable techniques.

The substrate 210 may include gate stacks formed by dielectric layers and electrode layers. The dielectric layers may include an interfacial layer (IL) and a high-k (HK) dielectric layer deposited by suitable techniques, such as chemical vapor deposition (CVD), atomic layer deposition (ALD), physical vapor deposition (PVD), thermal oxidation, combinations thereof, and/or other suitable techniques. The IL may include oxide, HfSiO and oxynitride and the HK dielectric layer may include LaO, AlO, ZrO, TiO, $Ta_2O_5$, $Y_2O_3$, $SrTiO_3$ (STO), $BaTiO_3$ (BTO), $BaZrO$, $HfZrO$, $HfLaO$, $HfSiO$, $LaSiO$, $HfTaO$, $HfTiO$, $(Ba,Sr)TiO_3$ (BST), $Al_2O_3$, $Si_3N_4$, oxynitrides (SiON), and/or other suitable materials. The electrode layer may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 420 may include Ti, Ag, Al, TiAlN, TaC, TaCN, TaSiN, Mn, Zr, TiN, TaN, Ru, Mo, Al, WN, Cu, W, any suitable materials and/or a combination thereof.

The substrate 210 may also include source/drain (S/D) features, which include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D features 220 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes.

The substrate 210 may also include conductive features integrated with the ILD layer in the substrate 210 to form an interconnect structure configured to couple the various p-type and n-type doped regions and the other functional features (such as gate electrodes), resulting a functional integrated circuit. In one example, the substrate 210 may include a portion of the interconnect structure and the interconnect structure includes a multi-layer interconnect (MLI) structure and an ILD layer over the substrate 210 integrated with a MLI structure, providing an electrical routing to couple various devices in the substrate 210 to the input/output power and signals. The interconnect structure includes various metal lines, contacts and via features (or via plugs). The metal lines provide horizontal electrical routing. The contacts provide vertical connection between silicon substrate and metal lines while via features provide vertical connection between metal lines in different metal layers.

The material layer 220 may include dielectric layer such as silicon oxide, silicon nitride, oxynitride, silicon carbide, and/or other dielectric layer. The material layer 220 may also include semiconductive layer such as germanium, silicon, gallium arsenide, aluminum gallium arsenide, silicon germanium gallium arsenide phosphide, gallium antimony indium antimony, indium gallium arsenide, indium arsenide, and/or other suitable semiconductive materials. The material layer 220 may also include conductive layer such as polysilicon, titanium oxide, titanium nitride, tantalum oxide, tantalum nitride, titanium, aluminum, titanium aluminum nitride, tantalum carbide, tantalum carbide nitride, tantalum silicon nitride, manganese, zirconium, ruthenium, molybdenum, copper, tungsten, tungsten nitride, and/or any suitable conductive materials. The material layer 220 may be deposited by CVD, ALD, PVD, and/or other suitable method.

Figure 3:
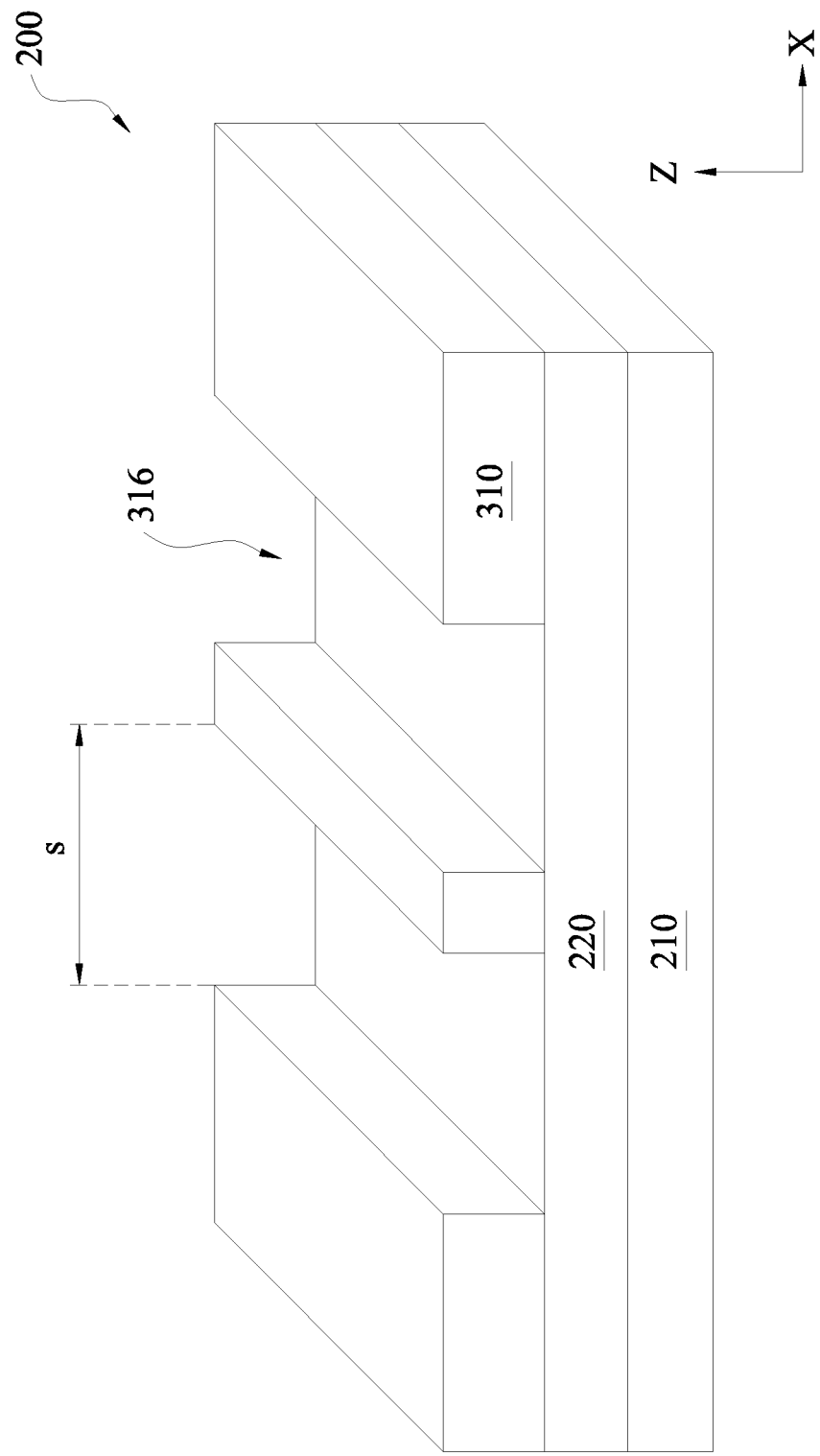

Referring to FIGS. 1 and 3, method 100 proceeds to step 104 by forming a first patterned hard mask (HM) 310 over the material layer 220. The first patterned HM 310 has a plurality of openings (or spaces) 316 and the material layer 220 is exposed in the spaces 316. Each space 316 has a predetermined space width (s) along x-direction which is perpendicular to the height of the first patterned HM 310, namely a Z-direction (as shown in FIG. 3). The patterned HM 310 is referred to as a guider HM because it will serve as guiding structure for a block copolymer (BCP) layer assembly process, which will be described in the following description.

The guider HM 310 may be formed by a procedure including deposition, patterning, etching, and/or a combination thereof. In some embodiments, the formation of the guider HM 310 may include depositing a HM material layer; forming a resist pattern and etching the HM material layer using the resist layer as an etch mask, thereby forming the guider HM 310. The resist pattern includes a resist material sensitive to a radiation beam and is formed by a lithography process. In one example, the lithography process includes coating a resist layer on the HM material layer, performing a lithography exposure process to the resist layer according to the IC layout and developing the exposed resist layer to form the resist pattern. The etching process includes a wet etch, a dry etch, and/or a combination thereof. The HM material layer may include silicon oxide, silicon nitride, oxynitride, silicon carbide, titanium oxide, titanium nitride, tantalum oxide, tantalum nitride, and/or any suitable materials. The HM material layer may include multiple layers. The HM material layer may be deposited by a suitable technique, such as CVD, PVD, ALD, spin-on coating, and/or other suitable technique.

Figure 4A:
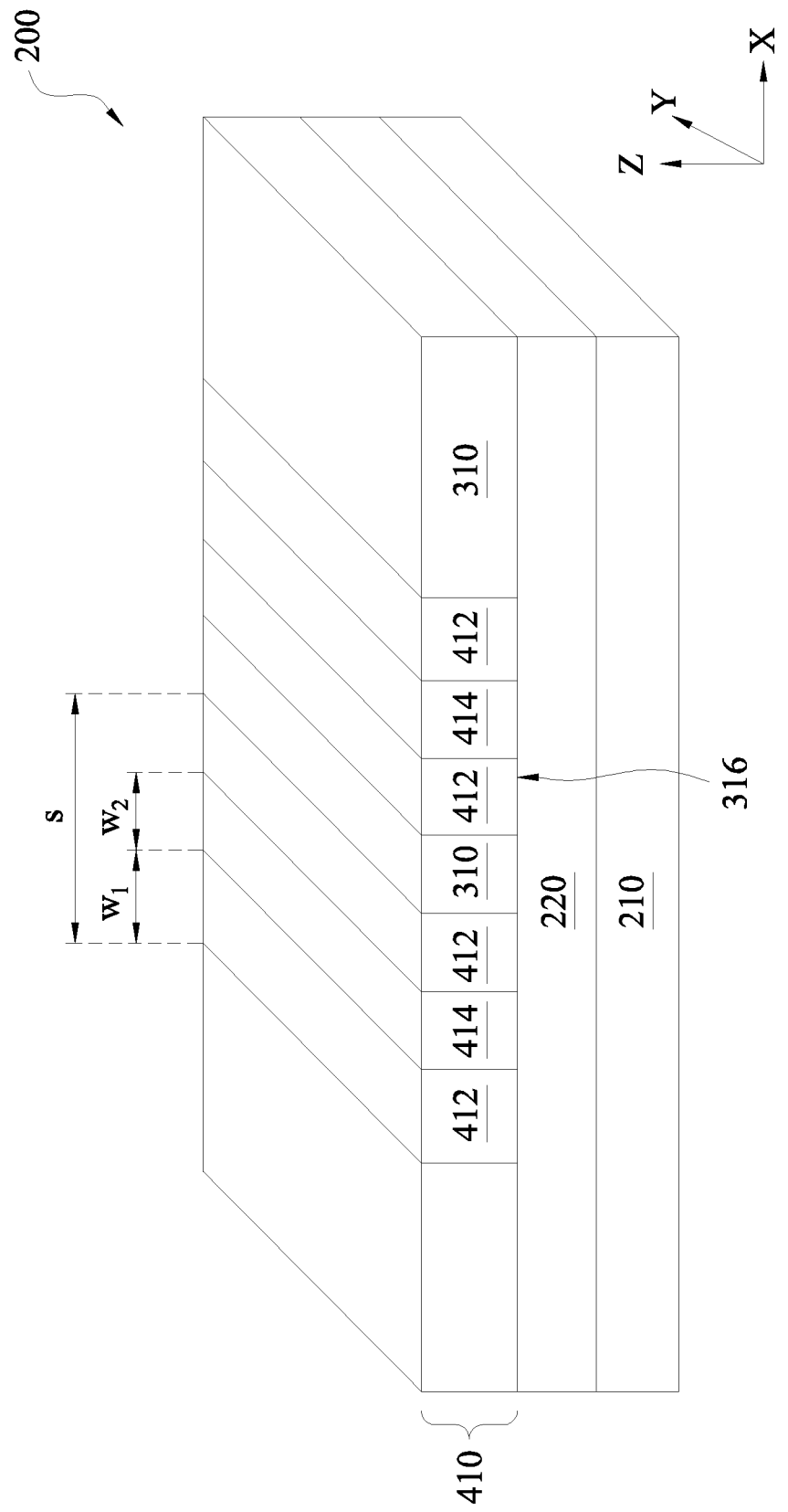

Referring to FIGS. 1 and 4A, method 100 proceeds to step 106 by forming highly ordered periodic polymer nanostructures, such as a first and second polymer nanostructure 412 and 414, in the plurality of spaces 316 defined by guider HM 310. In the present embodiment, a direct-self-assembly (DSA) layer 410 is deposited in the plurality of spaces 316. As has been mentioned above, the guider HM 310 serves as a guiding structure for a DSA layer 410 assembly process.

Figure 4B:
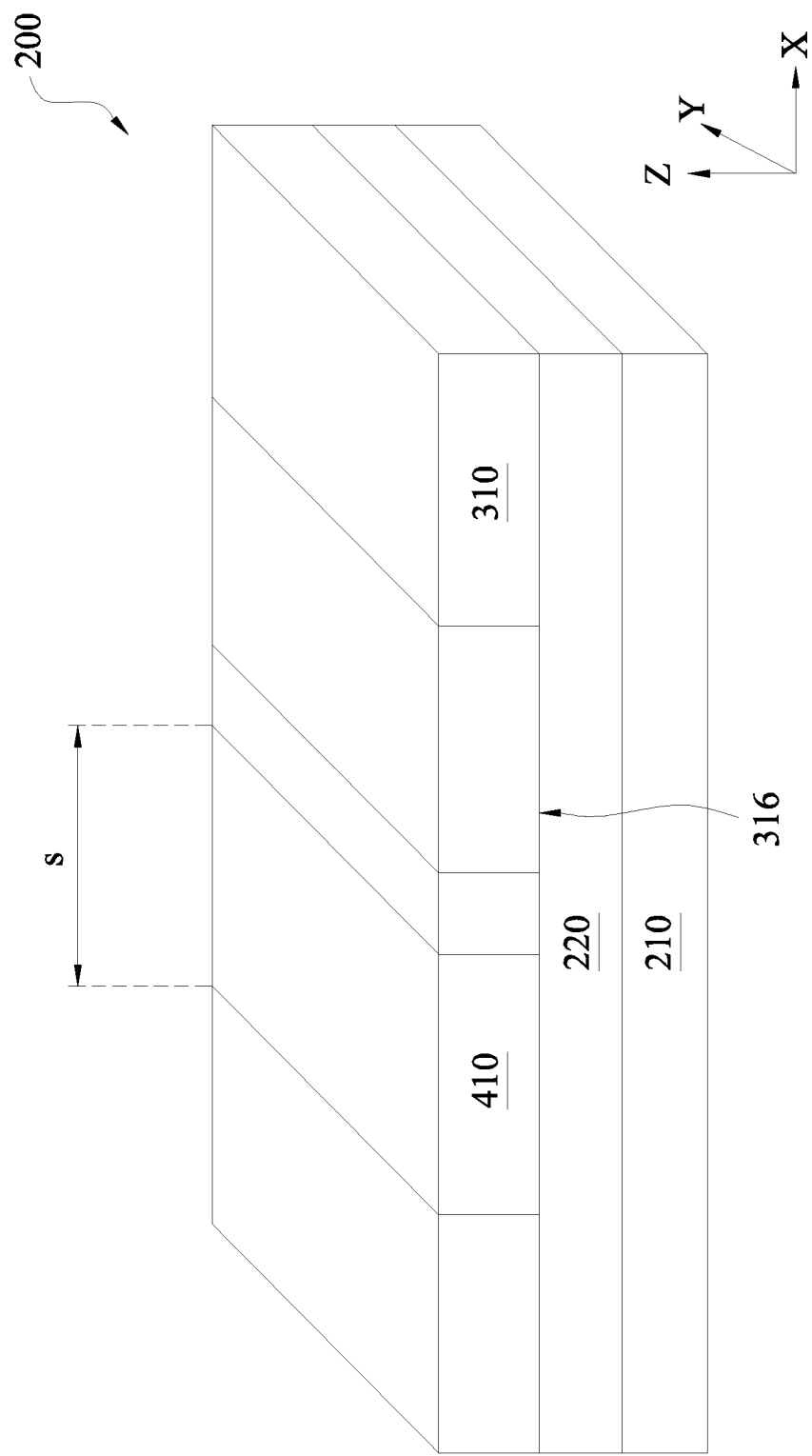
Figure 4C:
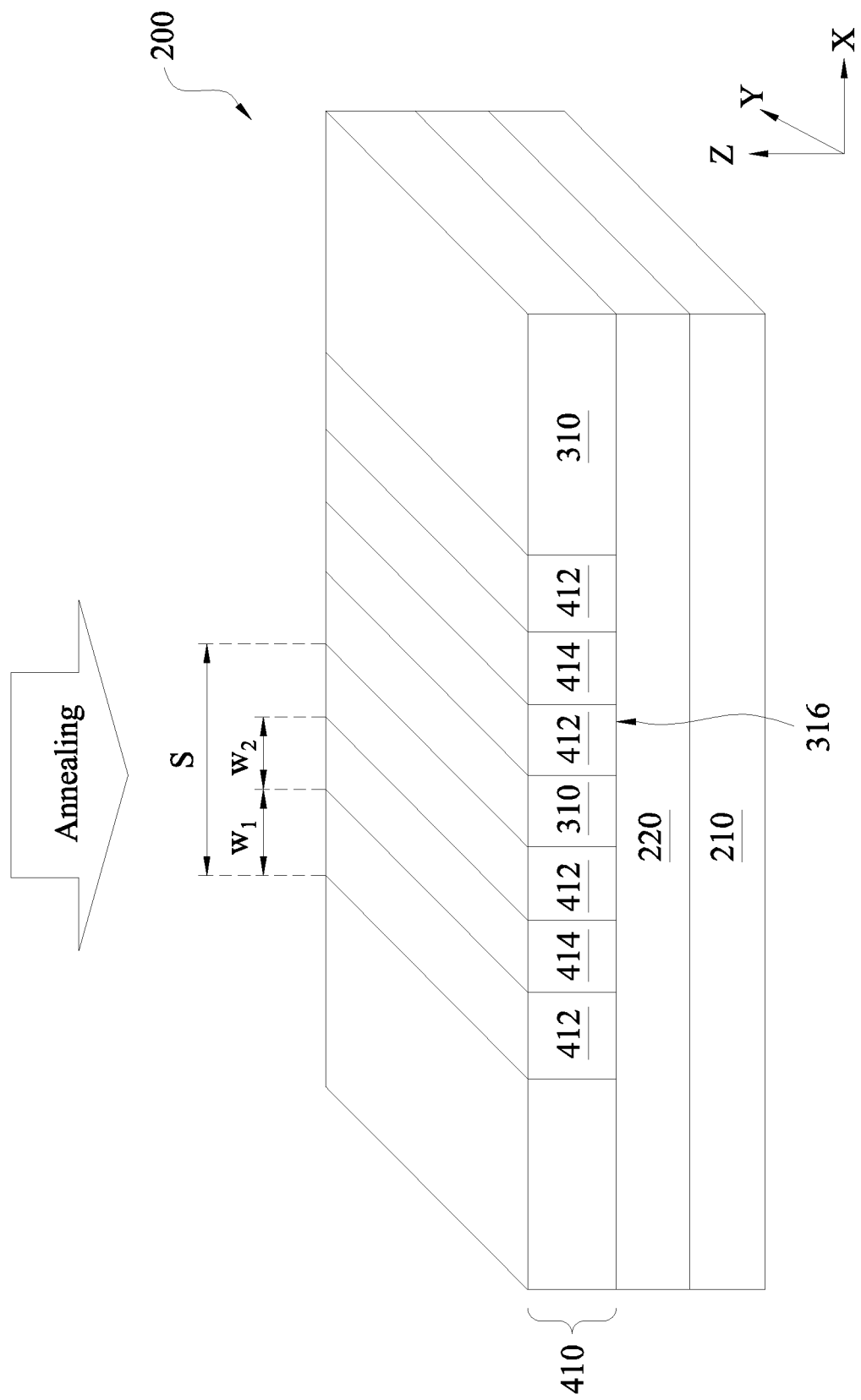

Referring to FIGS. 4B and 4C, in one embodiment, the DSA layer 410 includes block co-polymer (BCP). BCP is long-chain molecules comprised of at least two different segments and these segments can assemble themselves into highly ordered structures under a certain condition, such as when they are exposed to an elevated temperature. The BCP 410 may include one or more of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and/or polyisoprene-block-polymethylmethacrylate (PI-b-PMMA). The BCP 410 may be deposited by spin-on coating, spraying, dip coating, and/or other suitable depositions, as shown in FIG. 4B. In one embodiment, the BCP 410 includes a bi-block polymer PS-b-PMMA deposited by spin-on coating.

Additionally, prior to deposition of the BCP 410, a neutralize layer (NL) is deposited over the material layer 220 in the plurality of space 316 to enhance BCP 410 formation by modifying surface condition of the material layer 220 exposed in the plurality of space 316. The NL includes materials having a surface energy which is in the middle of the two components in the BCP. As an example, the NL includes silicon oxide or spin-on-glass (SOG). The NL may be deposited by ALD, CVD or spin-on coating.

After depositing the BCP 410, an elevated temperature anneal is applied to the BCP 410 to form highly ordered periodic polymer nanostructures in the plurality of spaces 316, as shown in FIG. 4C. In an embodiment, the BCP 410 having two polymeric units is annealed with a elevated temperature and forms two highly ordered self-assembling polymer nanostructures (polymer blocks), the first polymer block 412 and the second polymer block 414 in lamellar layer type along a Y-direction, which is perpendicular to the X-direction. The first polymer block 412 and the second polymer block 414 align next to each other in a repeating periodical pattern along the x-direction. The first and second polymer blocks 412 and 414 have a first width ($w_1$) and second width ($w_2$), respectively, and they are determined by material property of the BCP 410, such as radius of gyration of the polymer chain, molecular weight and interfacial tension. In one embodiment, the PS-b-PMMA 410 is annealed and forms polymer block, PMMA 412 and PS 414, in a periodical repeating pattern along the x-direction within the respective spaces 316. The first width $w_1$ and second width $w_2$ are about 30 nm. In another embodiment, the first width $w_1$ and second width $w_2$ are less than 20 nm.

Figure 5:
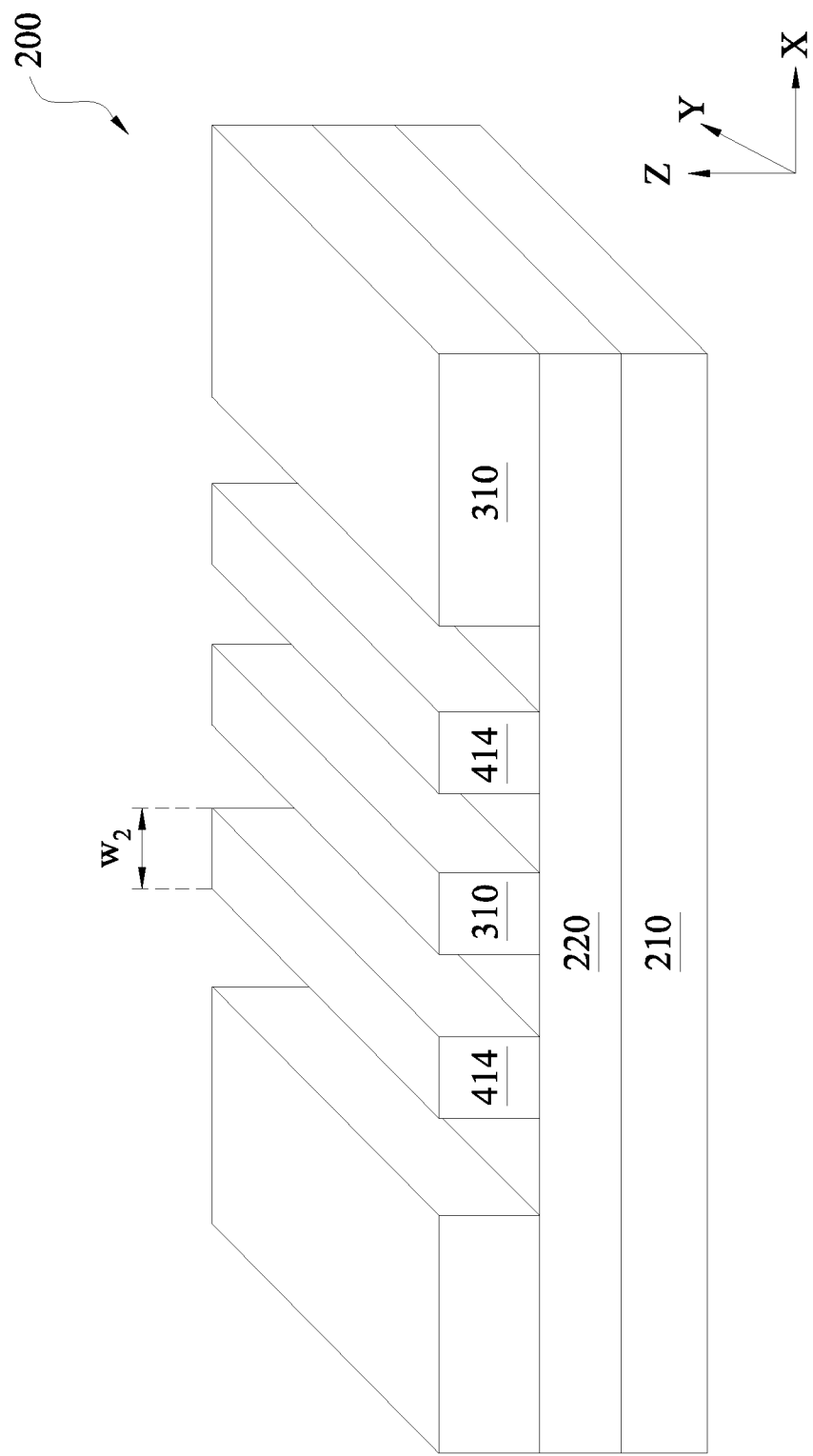

Referring to FIGS. 1 and 5, the method 100 proceeds to step 108 by removing a predetermined type of polymer nanostructures, such as the first polymer block 412. In the present embodiment, the first polymer block 412 is selectively decomposed. The selective decomposition includes dry etch, wet etch, or combinations thereof. As an example, the first polymer block 412 of PMMA is decomposed by oxygen plasma etch.

Figure 6:
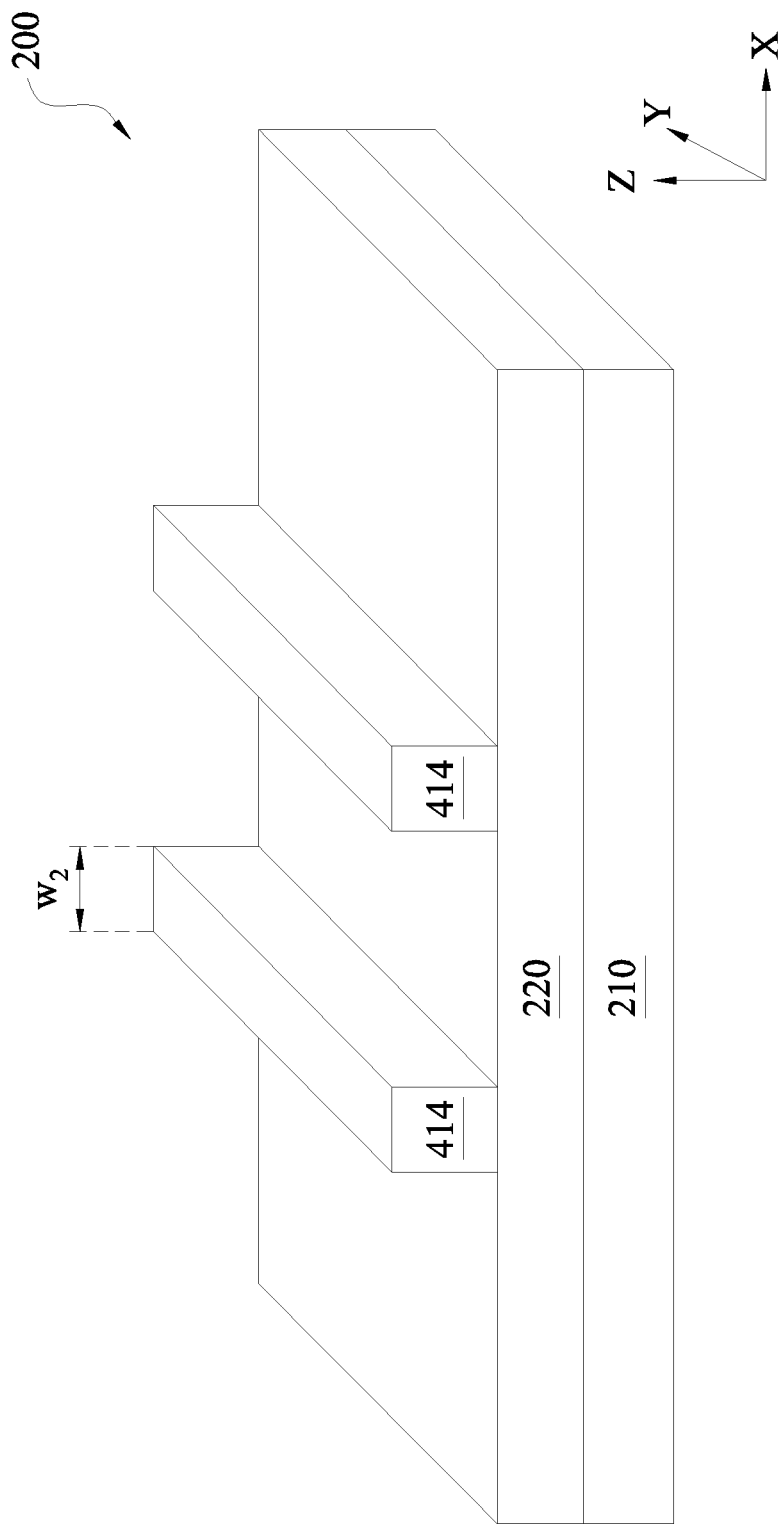

Referring to FIGS. 1 and 6, the method 100 proceeds to step 110 by removing the guider HM 310. In the present embodiment, the guider HM 310 is removed by a selective etch process. The etch process may include a selective wet etch, a selective dry etch, and/or a combination thereof. As an example, a selective wet etching solution may include $HNO_3$, $NH_4OH$, $KOH$, $HF$, $HCl$, $NaOH$, $H_3PO_4$, TMAH, and/or other suitable selective wet etching solutions, and/or combinations thereof. Alternatively, a selective dry etching process may implement chlorine-containing gas (e.g., $Cl_2$, $CHCl_3$, $CCl_4$, and/or $BCl_3$), bromine-containing gas (e.g. HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof.

It is noted here that, after removing the guider HM 310, the predetermined type of the polymer nanostructure, such as the second polymer block 414, remains over the material layer 220 to serve as mandrels for subsequent processes, which has the second width $w_2$. In the present embodiment, instead of using lithography process, the second width $w_2$ of mandrels (second polymer block 414) is defined by material property of the BCP 410.

Figure 7:
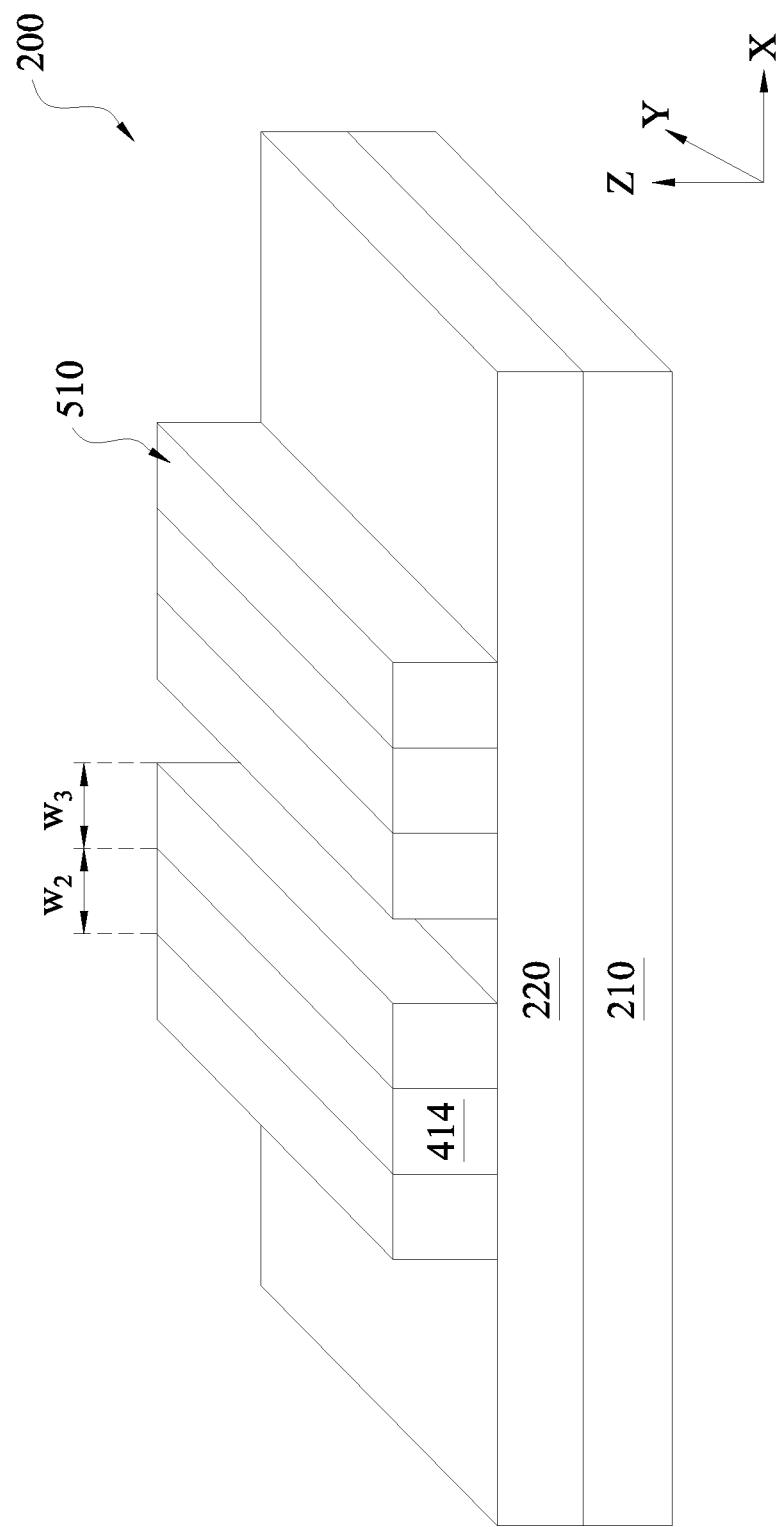

Referring to FIGS. 1 and 7, method 100 proceeds to step 112 by forming spacers 510 along the respective second polymer blocks 414. The spacers 510 may be formed by depositing a spacer material layer over the second polymer block 414, and followed by a spacer etch to etch the spacer material layer anisotropically. The spacer material layer may include silicon oxide, silicon nitride, oxynitride, silicon carbide, titanium oxide, titanium nitride, tantalum oxide, tantalum nitride, and/or any suitable materials. In the present embodiment, the spacer material layer includes a material which is different from the second polymer block 414 and the material layer 220 to achieve etch selectivity in subsequent etches. The spacer layer may be deposited by CVD, ALD, PVD, and/or other suitable techniques. In one embodiment, the spacer material layer is deposited by ALD to achieve conformable film coverage along the sidewalls of the second polymer block 414. By controlling the thickness of the spacer material layer, the spacers 510 are formed to have a target width, a third width $w_3$, which can be quite small, such as about 10 nm. Additionally, being formed by spacer processes, the third width $w_3$ of the spacers 510 can be made relatively uniform across different areas, including where there may be different pattern densities from one area to another area.

Figure 8:
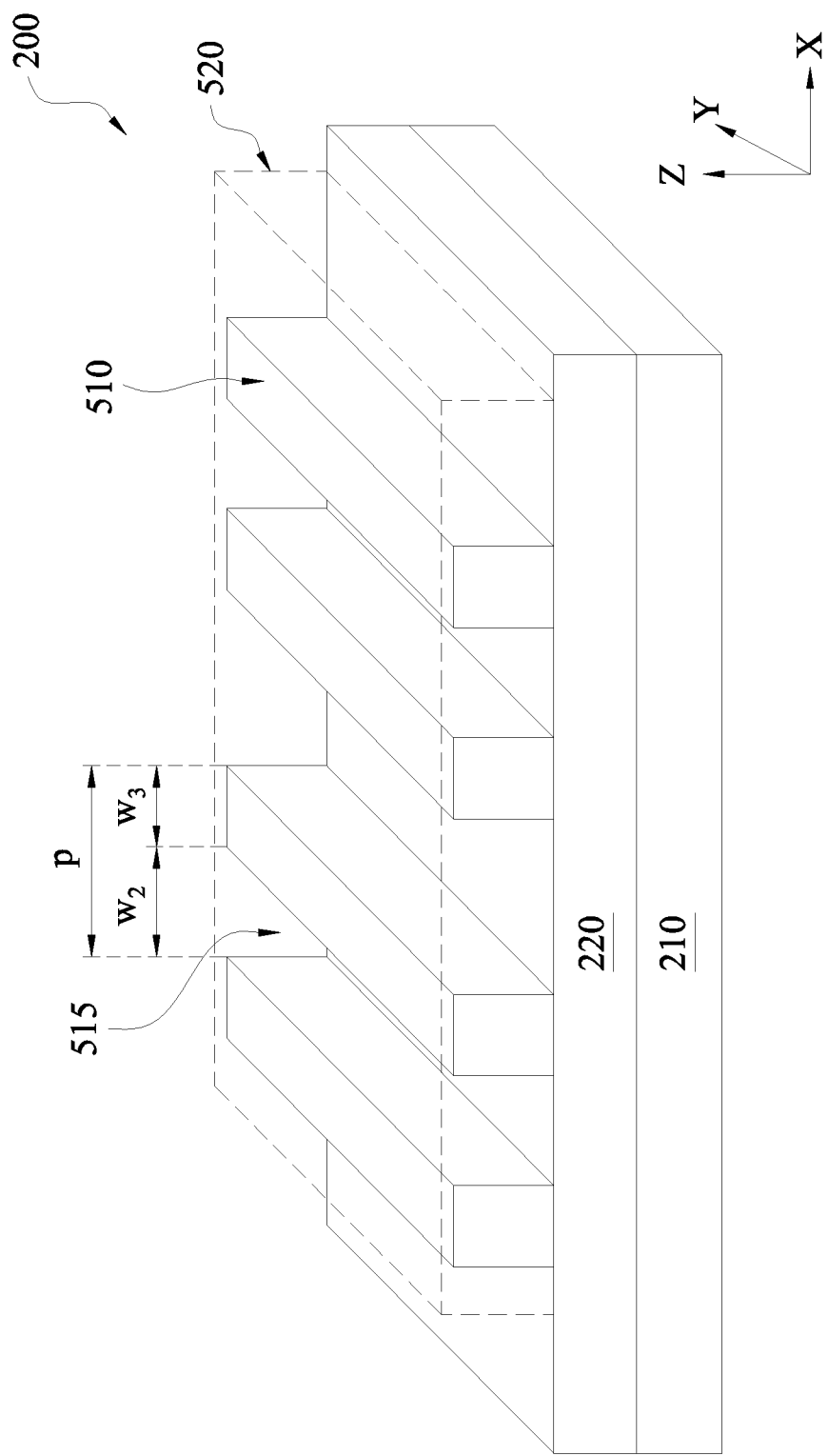

Referring to FIGS. 1 and 8, the method 100 proceeds to step 114 by selectively decomposing (or removing) the remaining other types polymer nanostructures, such as the second polymer block 414, to leave a second space 515 between two adjacent spacers 510. As a result, the second space 515 carries the second width $w_2$ of the second polymer block 414. The selective decomposition includes anneal, dry etch, wet etch, and/or any other suitable processes. In one embodiment, the PS polymer block 414 is decomposed through annealing process that includes a temperature that is higher temperature than the annealing temperature used during the forming of the polymer blocks in step 106. As an example, the temperature of decomposing annealing is about 350° C. while the temperature of forming annealing is about 250° C. In another embodiment, the PS polymer block 414 is decomposed by a wet etch containing solutions of sulfuric acid ($H_2SO_4$) and peroxide ($H_2O_2$).

As a result, the spacers 510 separated by respective second spaces 515 forms a second patterned HM 520. The second patterned HM 520 has a pitch p, which equals to the width of the spacer 510 (namely the third width $w_3$) plus a width of the second space 515 (namely the second width $w_2$), as shown in FIG. 8. It is noted here that the dimension of the pitch is achieved from the difference of two structures: the spacer 510 and the second polymer block 414. In other words, the dimension of the pitch is achieved by a non-lithography process. This small dimension formation via a non-lithography process is significant in that it allows for the utilization of smaller critical dimensions (CD). CD reduction is a challenge for lithography process, which become one of the limiting factors for future technology generations or nodes. Thus, the present disclosure provides a small CD formation method with a relaxed lithography process in the formation of a patterned HM 520.

Figure 9A:
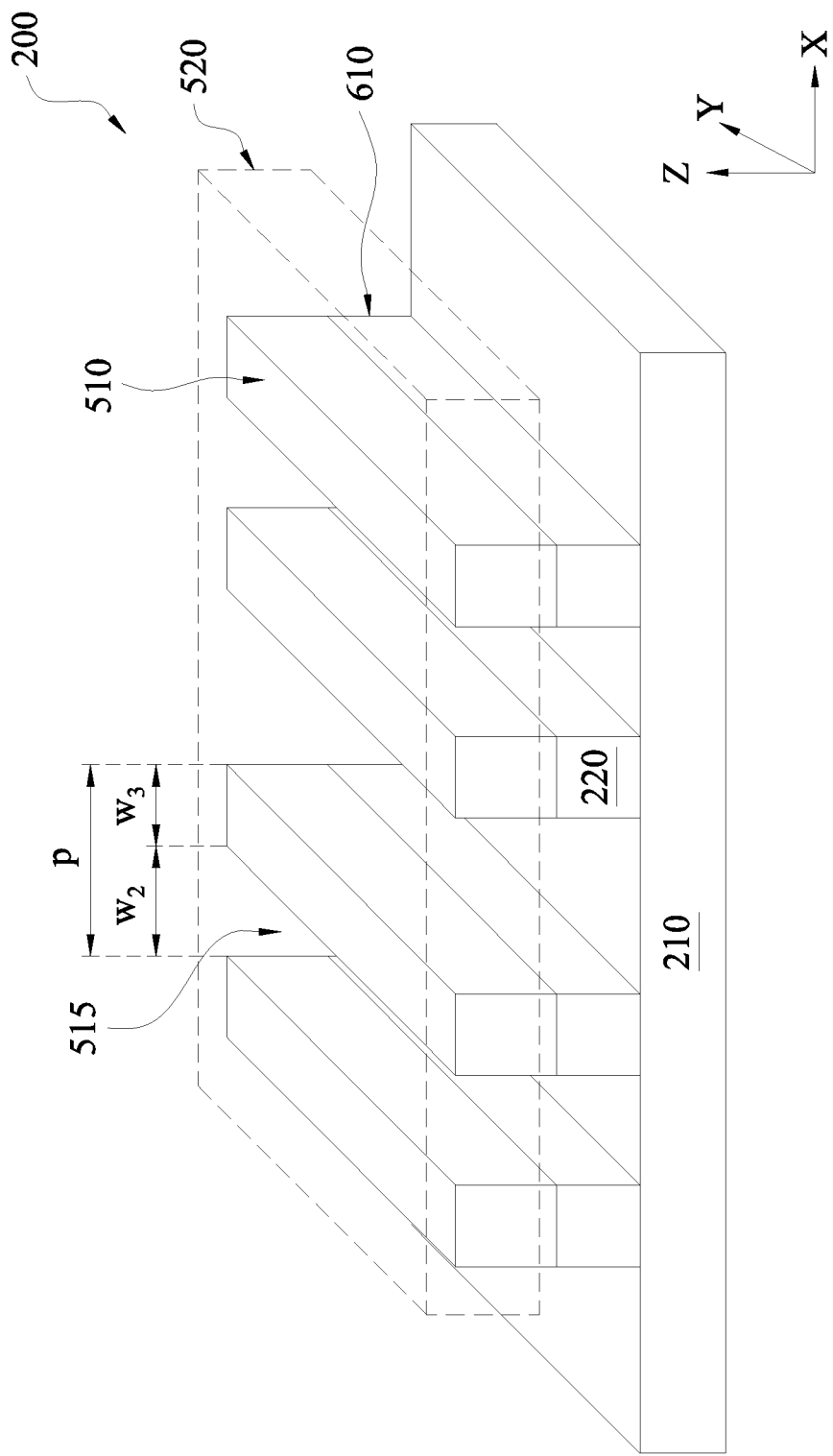

Referring to FIGS. 1 and 9A, the method 100 proceeds to step 116 by etching the material layer 220 by using the second patterned HM 520 as an etch mask. As a result, the spacers 510 are transferred to material features 610 in the material layer 220 while in meantime, in the second space 515 is extended to the material layer 220. In some embodiments, the etch process may include an anisotropic etch, such as a plasma anisotropic etch. Accordingly, the material features 610 are formed with vertical profiles. Thus, the material feature 610 carries the third width $w_3$ and is spaced away from another material feature 610 by the second width $w_2$. In other words, the pitch p of the second patterned HM 520 is transferred to the material layer 220. The anisotropic etch may implement chlorine-containing gas (e.g., $Cl_2$, $CHCl_3$, $CCl_4$, and/or $BCl_3$), bromine-containing gas (e.g. HBr and/or $CHBr_3$), iodine-containing gas, fluorine-containing gas (e.g., $CF_4$, $SF_6$, $CH_2F_2$, $CHF_3$, and/or $C_2F_6$), and/or other suitable gases and/or plasmas, and/or combinations thereof.

Figure 9B:
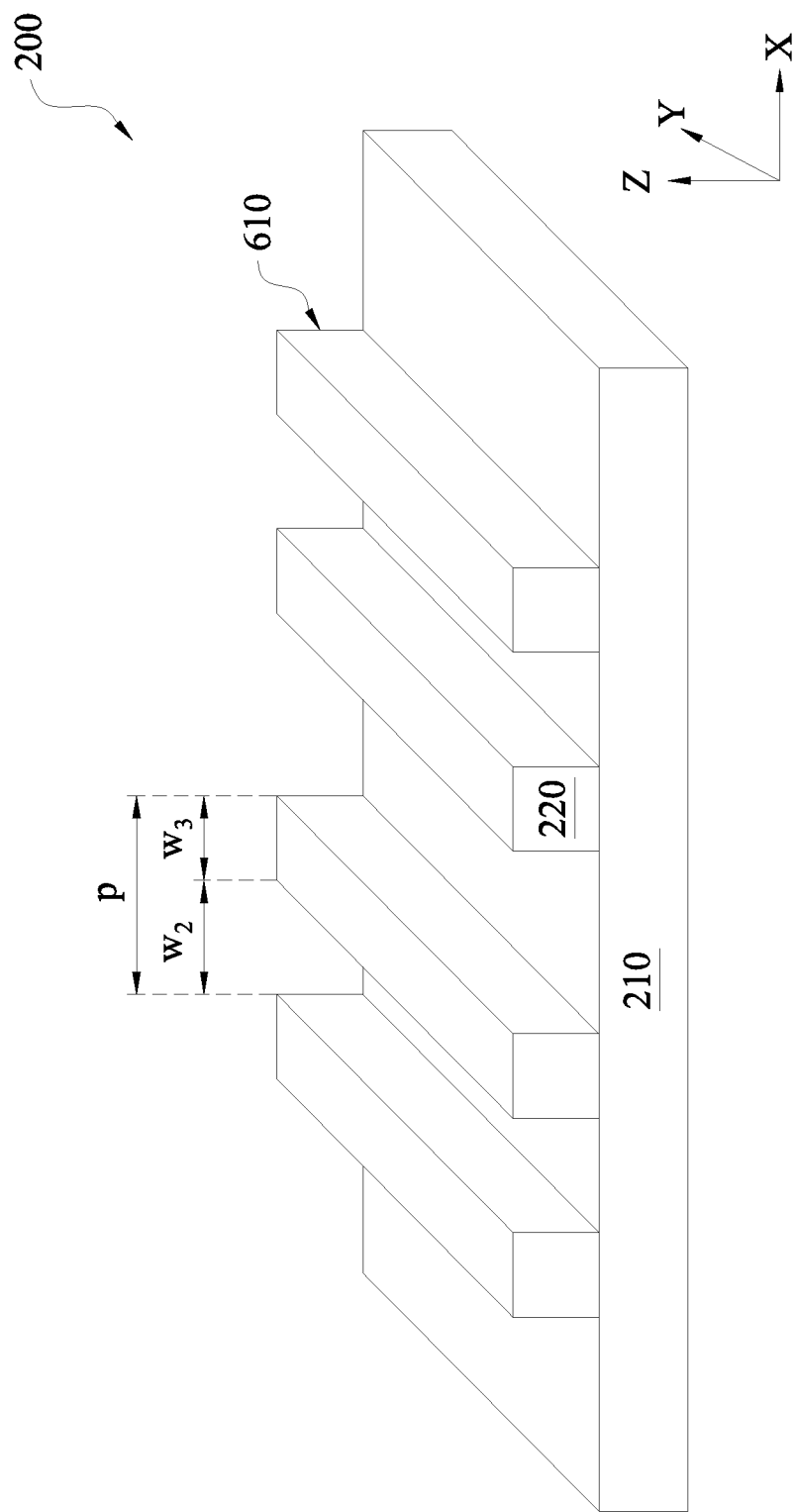

After etching the material layer 220, the second patterned HM 520 is removed by a proper etch process, as shown in FIG. 9B. As a result, the material layer 220 is patterned with the pitch p (equals to ($w_2+w_3$)).

Additional steps can be provided before, during, and after the method 100, and some of the steps described can be replaced or eliminated for other embodiments of the method.

The device 200 may undergo further CMOS or MOS technology processing to form various features and regions known in the art. For example, subsequent processing may form a multilayer interconnection includes vertical interconnects, such as conventional vias or contacts, and horizontal interconnects, such as metal lines. The various interconnection features may implement various conductive materials including copper, tungsten, and/or silicide to provide electrical routings to couple various devices in the substrate 210 to the input/output power and signals.

Based on the above, the present disclosure offers methods for forming a patterned hard mask. Instead of using lithography process, the method employs forming a guiding hard mask, forming block co-polymer (BCP) over the guiding hard mask and sidewall spacers to define a targeted pitch of the patterned hard mask. The method also employs transferring the pitch of the patterned hard mask to a material layer. The method demonstrates a robust, flexible and pseudo-non-lithography method for patterning a material layer with small size pitch.

The present disclosure provides many different embodiments of fabricating a semiconductor device that provide one or more improvements over existing approaches. In one embodiment, a method for fabricating a semiconductor device includes forming a first patterned hard mask over a material layer. The first patterned hard mask defines an opening. The method also includes forming a direct-self-assembly (DSA) layer having a first portion and a second portion within the opening, removing the first portion of the DSA layer, forming spacers along sidewalls of the second portion of the DSA layer and removing the second portion of the DSA layer. The spacers form a second patterned hard mask over the material layer.

In another embodiment, a method includes forming a patterned hard mask over a material layer. The patterned hard mask has a plurality of openings. The method also includes depositing a block co-polymer (BCP) layer within the plurality of openings, annealing the BCP layer at a first temperature to form a first polymer block and a second polymer block within the plurality of openings, removing the first polymer blocks, forming spacers along sidewalls of the second polymer blocks and removing the second polymer blocks. The spacers form a second patterned HM over the material layer.

In yet another embodiment, a method includes forming a patterned hard mask over a material layer. The patterned hard mask has an opening. The method also includes forming a first nanostructure and a second nanostructure within the opening. The first nanostructure is formed of a different material than the second nanostructure. The method also includes removing the first nanostructure, removing the patterned hard mask, forming spacers along sidewalls of the second nanostructure, removing the second nanostructures and etching the material layer by using spaces as etching mask.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first patterned hard mask (HM) over a material layer, the first patterned hard mask defining an opening;
   forming a direct-self-assembly (DSA) layer by depositing a block co-polymer (BCP) layer over the first patterned HM and annealing the BCP layer at a first temperature, wherein the DSA layer has a first portion and a second portion within the opening;
   removing the first portion of the DSA layer;
   forming spacers along sidewalls of the second portion of the DSA layer; and
   removing the second portion of the DSA layer by annealing with a second temperature that is higher than the first temperature, resulting in the spacers forming a second patterned hard mask over the material layer.

2. The method of claim 1, wherein the BCP layer includes one or more materials from the group consisting of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

3. The method of claim 2, wherein the first portion includes a PMMA block and the second portion includes a PS block.

4. The method of claim 2, wherein removing the first portion of the DSA layer includes decomposing the PMMA block by oxygen plasma etch process.

5. The method of claim 1, further comprising removing the first patterned hard mask after removing the first portion of the DSA layer.

6. The method of claim 1, further comprising etching the material layer through the second patterned HM.

7. The method of claim 6, wherein a pitch size of the material layer is defined by a width of the spacer and a width of the second portion of the DSA layer.

8. The method of claim 1, wherein the material layer includes a semiconductor layer comprising germanium, silicon, gallium arsenide, aluminum gallium arsenide, silicon germanium arsenide phosphide, gallium antimony, indium antimony, indium gallium arsenide, indium arsenide, or mixtures thereof.

9. The method of claim 1, wherein the material layer includes a conductive layer comprising poly-silicon, titanium oxide, titanium nitride, tantalum oxide, tantalum nitride, titanium, titanium, aluminum, titanium aluminum nitride, tantalum carbide, tantalum carbide nitride, tantalum silicon nitride, manganese, zirconium, ruthenium, molybdenum, copper, tungsten, tungsten nitride, or mixtures thereof.

10. A method comprising:
    forming a first patterned hard mask (HM) over a material layer, wherein the first patterned hard mask has a plurality of openings;
    depositing a block co-polymer (BCP) layer within the plurality of openings;

annealing the BCP layer at a first temperature to form first polymer blocks and second polymer blocks within the plurality of openings;

removing the first polymer blocks;

forming spacers along sidewalls of the second polymer blocks; and removing the second polymer blocks by annealing with a second temperature that is higher than the first temperature, resulting in the spacers forming a second patterned HM over the material layer.

11. The method of claim 10, wherein the BCP layer includes one or more materials from the group consisting of polystyrene-block-polymethylmethacrylate (PS-b-PMMA), polyethyleneoxide-block-polyisoprene (PEO-b-PI), polyethyleneoxide-block-polybutadiene (PEO-b-PBD), polyethyleneoxide-block-polystyrene (PEO-b-PS), polyethyleneoxide-block-polymethylmethacrylate (PEO-b-PMMA), polyethyleneoxide-block-polyethylethylene (PEO-b-PEE), polystyrene-block-polyvinylpyridine (PS-b-PVP), polystyrene-block-polyisoprene (PS-b-PI), polystyrene-block-polybutadiene (PS-b-PBD), polystyrene-block-polyferrocenyldimethylsilane (PS-b-PFS), polybutadiene-block-polyvinylpyridine (PBD-b-PVP), and polyisoprene-block-polymethylmethacrylate (PI-b-PMMA).

12. The method of claim 11, wherein the first polymer blocks include a PMMA block and the second polymer blocks include a PS block.

13. The method of claim 11, wherein removing the first polymer blocks includes decomposing the PMMA block by performing oxygen plasma etch process.

14. The method of claim 10, further comprising removing the first patterned hard mask after removing the first polymer blocks of the BCP layer.

15. The method of claim 10, further comprising etching the material layer through the second patterned HM.

16. The method of claim 15, wherein a pitch size of the material layer is defined by a width of the spacer and a width of the second polymer blocks.

17. The method of claim 10, wherein the first temperature is about 250° C. and the second temperature is about 350° C.

18. A method comprising:

forming a patterned hard mask over a material layer, wherein the patterned hard mask has an opening;

forming a neutralize (NL) layer within the opening;

forming a first nanostructure and a second nanostructure on the neutralize layer by depositing a block copolymer (BCP) layer within the opening and annealing the BCP, wherein the first nanostructure is formed of a different material than the second nanostructure;

removing the first nanostructure;

removing the patterned hard mask;

forming spacers along sidewalls of the second nanostructure;

removing the second nanostructure; and etching the material layer by using spacers as an etching mask.

19. The method of claim 18, wherein the NL layer has a surface energy that is between the surface energy of the first nanostructure and the surface energy of the second nanostructure.

20. The method of claim 18, wherein the NL layer comprises silicon oxide or spin-on-glass (SOG).

* * * * *